Figure 1A:
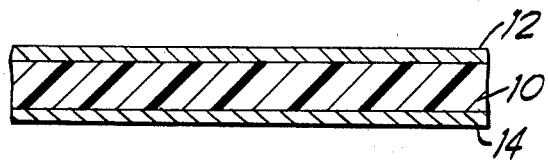
Figure 1B:
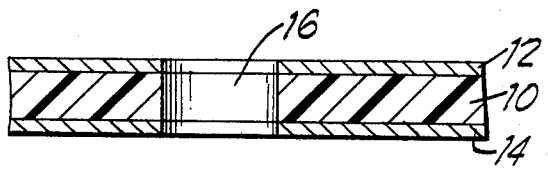
Figure 1C:
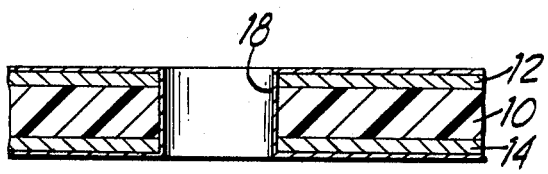
Figure 1D:
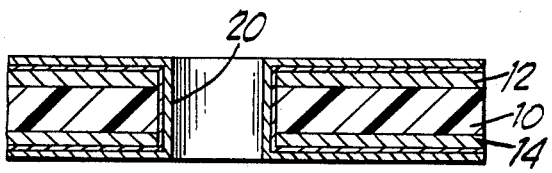
Figure 1E:
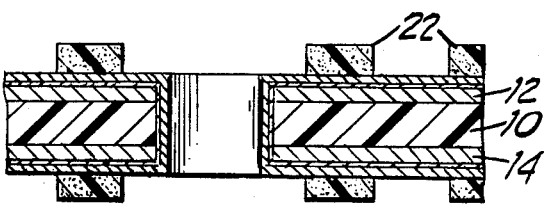
Figure 1F:
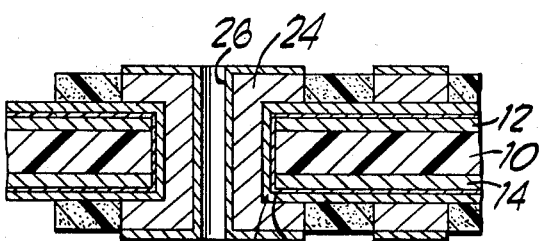
Figure 1G:
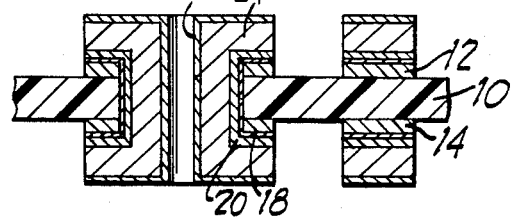
Figure 1H:
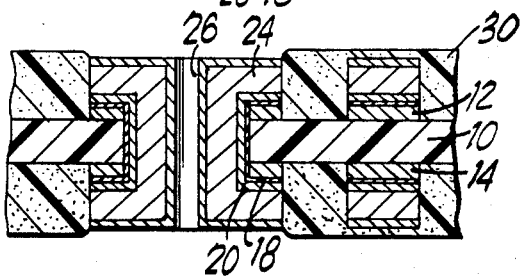

United States Patent [19]

Leech et al.

[11] Patent Number: 4,510,276

[45] Date of Patent: Apr. 9, 1985

[54] EPOXY RESIN COATING COMPOSITIONS FOR PRINTED CIRCUIT BOARDS

[75] Inventors: Edward J. Leech, Oyster Bay; Frank D. Russo, West Sayville, both of N.Y.

[73] Assignee: Kollmorgen Technologies Corporation, Dallas, Tex.

[21] Appl. No.: 103,600

[22] Filed: Dec. 14, 1979

Related U.S. Application Data

[63] Continuation-in-part of Ser. No. 103,340, Dec. 13, 1979, abandoned, which is a continuation-in-part of Ser. No. 3,099, Jan. 12, 1979, abandoned.

[51] Int. Cl.$^3$ .................. C08L 63/00; C08L 63/10
[52] U.S. Cl. .................. 523/427; 428/901; 523/428; 523/434; 523/437; 523/438; 525/113; 525/504; 525/523; 525/476
[58] Field of Search .................. 260/37 EP; 525/113, 525/523, 504; 428/901; 523/427, 428, 434, 437, 438

[56] References Cited

U.S. PATENT DOCUMENTS

| | | | |
|---|---|---|---|
| 3,374,186 | 3/1968 | Steden et al. | 525/504 |
| 3,519,602 | 7/1970 | Castro et al. | 260/18 EP |
| 3,816,364 | 6/1974 | Bayer | 260/18 EP |
| 3,864,426 | 2/1975 | Salensky | 525/113 |
| 3,926,904 | 12/1975 | Scola | 260/32.8 EP |
| 4,240,945 | 12/1980 | Gabrick | 260/21 |

FOREIGN PATENT DOCUMENTS 2131929 1/1973 Fed. Rep. of Germany ...... 525/113

*Primary Examiner*—Wilbert J. Briggs, Sr.
*Attorney, Agent, or Firm*—Morgan, Finnegan, Pine, Foley & Lee

[57] ABSTRACT

A resinous protective coating useful in adhering plastics to metallic substrates. The protective coating is particularly useful as a solder mask and in the manufacture of printed circuit boards with circuit patterns having a resolution of at least 0.25 mm lines and spaces thereon. The protective coating comprises resins dissolved in solvents, wherein the coating, upon being subjected to heat, goes from a liquid or soft "gel-like" state into a solid phase without bleeding. The protective coating is resistant to copper, nickel and gold electroplating baths, adheres to insulating substrates, adhesive coated base materials as well as metallic substrates and is capable of withstanding the thermal shock of dip soldering.

18 Claims, 49 Drawing Figures

EPOXY RESIN COATING COMPOSITIONS FOR PRINTED CIRCUIT BOARDS

RELATED APPLICATIONS

This application is a continuation-in-part of my U.S. application Ser. No. 103,340 filed Dec. 13, 1979, now abandoned, entitled "HIGH RESOLUTION SCREEN PRINTABLE RESISTS", which in turn is a continuation-in-part of my U.S. application, Ser. No. 3,099, filed Jan. 12, 1979, now abandoned.

BACKGROUND OF THE INVENTION

1. Field of the Invention

This invention relates in general to a resinous protective coating capable of being applied to preselected portions of an insulating or metallic substrate. More particularly, the present invention relates to a resinous composition that adheres well to metallic and plastic surfaces and adheres especially well to copper, a surface which is difficult to bond to. The present invention also relates to a resinous protective coating for use in producing patterns on circuit boards, the protective coating including a highly functional solid resin having a melting point between about 60° C. and about 200° C.

2. Description of the Prior Art

A problem in the prior art is the poor adhesion of plastics to copper substrates. It is well known, for example, that copper oxidizes even when covered with a coating layer and that consequently organic coatings do not adhere as well to the loosely adherent oxidized copper films. In fact, the organic coating separates after a period of time from the copper substrate due to postulated diffusion of oxygen through the coating on the copper substrate and subsequent oxidations of the copper substrate. Attempts to solve this problem have included precoating the copper substrate with an adherent copper oxide, e.g., a hot alkaline hypochlorite solution such as Ebonol C (commercially available from Enthone Company, a division of Asarco, West Haven, Conn.), or coating the copper substrate with brass or zinc plating.

Also, methods employed in the manufacture of printed circuit boards typically contain at least one step in which a permanent protective coating is employed. Illustrative of these methods are the following:

In one method of producing circuit boards, a background pattern is printed with a permanent protective coating which leaves exposed a pattern on an adhesive coated laminate. The adhesive coated laminate contains catalytic material therewithin which allows the laminate to initiate electroless metal plating. The permanent protective coating or mask is hardened by curing, and the exposed pattern on the laminate is activated in an oxidizing solution, such as chromic-sulfuric acid solution to render the exposed pattern receptive to electroless copper plating with good adhesion of the copper to the activated surface. The permanent mask resists activation by the chromic-sulfuric acid solution. Copper is deposited on the exposed areas of the adhesive coated laminate to form an electrically conductive pattern via electroless deposition.

In another method of producing circuit boards, a laminate is coated with a non-catalytic adhesive. The entire laminate is then etched with an oxidizing solution, such as a chromic-sulfuric acid solution before being seeded and sensitized with a catalytic solution, such as palladium-tin-chloride. A background permanent mask or protective coating is then printed on the laminate before copper is electrolessly deposited on the exposed areas of the laminate in the form of the printed pattern.

In another method of producing printed circuit boards, a "print and etch" technique is employed. Copper foil is laminated to one or more sides of an insulating substrate, a positive pattern is printed (screen, photographically, etc.) with a temporary protective coating or resist, background copper is then etched away by subjecting the substrate to an etching solution, e.g. ferric chloride, ammonium persulfate and the like, the temporary resist is moved from the substrate using appropriate solvents, e.g. alkali soluble resists are removed with alkali solvents, holes are produced on the substrate by a laser beam, punching, drilling and the like, the substrate is sensitized and seeded by contacting it with, for example, aqueous acidic solutions of stannous tin ions and precious metal ions such as palladium ions, a registered solder mask which is a permanent protective coating is printed (screen, etc.) onto the substrate leaving lands and holes exposed, copper is electrolessly deposited onto the exposed lands and holes, but not the heat cured solder mask and the substrate is then dipped into molten solder to cause solder to adhere to the copper coated lands and holes.

In another method of producing printed circuit boards, a "fully additive" technique is employed. A suitable insulating substratum is prepared having a distance between hole centers of about 2.5 mm or less, the substratum and walls of the holes are sensitized and seeded using known seeding and sensitizing agents such as stannous chloride, palladium chloride activation, a permanent protective coating or resist is screened to produce a permanent background resist leaving the desired circuit pattern exposed, the pattern having as low as about 0.35 mm between lines, the resist is heat cured; copper is electrolessly deposited on the exposed pattern and in the holes and the board is then dip soldered.

In another method of producing printed circuit boards, a "semi-additive" technique is employed. An insulating substrate is prepared having holes on 2.5 mm centers, the walls of the holes and the surface(s) of the substrate are sensitized and seeded in a conventional manner, copper is electrolessly deposited over the entire surface of the board and in the holes, a temporary protective coating or resist is employed to print a circuit pattern having 0.35 mm lines, the temporary resist is heat cured, the circuit pattern is built up by electroplating a metal onto the exposed areas of the substrate, the temporary resist is removed, the thin layer of electroless copper which had been covered by the mask is etched away, a permanent registered solder mask is printed and heat cured, and the substrate is then dip soldered.

In another method of producing circuit boards, a printed circuit is prepared on an insulating substratum by the print and etch technique, a permanent registered solder mask is printed thereover leaving lands and holes exposed, the permanent mask is cured, copper is electrolessly deposited on the walls of through-holes formed in the insulating substratum, and the circuit is dipped in molten solder to cause solder to adhere to the lands and holes. Another modification of these methods involves using a fully additive process to prepare the printed circuit board on the first step, the remaining steps being the same.

The permanent protective coatings used as resists, solder masks, etc. in the prior arts methods of producing circuit boards have had a number of deficiencies which are set forth subsequently herein. For high density circuits, it has been customary to use dry film photoresists which are extremely costly. Screen printed resists or masks, while economical, have not been able to achieve the high resolution necessary for high density circuit boards. For example, the problems associated with the use of prior art solder masks such as the PC-401 Series Solder Mask (commercially available from Kollmorgen Corporation, Glen Cove, N.Y.) are detailed hereinbelow as an illustration of the type of problem also associated with the use of other resinous protective coating compositions of the prior art as permanent resists or the like.

Virtually all printed circuit board assemblies, even in small quantity production, are wave or dip soldered. Heretofore, in producing circuit boards which have a high circuit density per unit area, difficulty has been experienced due to the fact that the holes in such boards: (1) tend to have an extremely small diameter e.g. 0.35–1 mm; and (2) tend to be extremely closely spaced at least in some portions of the circuitry. High density boards may also have hole centers spaced a distance of less than 1 mm. When the holes are less than 2.5 mm apart with a conductor between the holes, it is practically impossible to print a registered permanent solder mask over the conductor without smearing solder mask around the lands adjacent the holes. In conventional practice, a plated through hole circuit board is produced with a circuit on one or more exposed surfaces. Before soldering, a registered solder mask is printed on the circuit pattern(s) to leave holes and lands or pads (i.e., small areas on the surface surrounding the holes) as well as fingers (i.e., terminal or contact areas of the circuit pattern) exposed. Subsequently, the components are fastened to the circuit as by passing over a solder wave to apply solder to the component leads and on the exposed areas, i.e., on the exposed lands and in the metallized holes. The solder mask protects the major portion of the circuit from the solder and thus guards against short circuiting by confining solder to only those areas where it is desired.

In such conventional circuits, the lands or pads are exposed while conductor lines making up the conductor pattern or patterns are protected by the solder mask. Accordingly, when the circuit density is high, it is extremely difficult to print a registered solder mask so as to provide exposed land or pad areas surrounding the holes without some solder mask accidentally lodging on the barrel of the hole.

Conventional registered, screen printed solder masks have other disadvantages. To maintain fine printing tolerances in such boards, extremely thin prints are used. Thus, even when great precautions are taken in printing the solder mask on high density circuit boards of the type described, there is a good possibility of the masks breaking down in part, thereby causing the solder to bridge from one land to another, or from one conductor line to another, which in turn results in short circuiting on the finished board. When thicker prints are used to avoid mask breakdown, the solder mask tends to block the holes, thereby preventing proper soldering.

In the prior art, various thermosetting resinous compositions have been used to provide protective coatings such as plating resists, temporary or permanent resists and solder masks. The thermosetting resins used in these compositions had low melting points were liquid at room temperature. These resinous protective coatings were incapable of providing lines and spaces having a resolution lower than 0.6 mm without bleeding over into the exposed holes and lands surrounding the holes when a conductive pattern was being screened. These resins flowed at temperatures from about room temperature up to about 160° F. during curing. Consequently, after the prior art thermosetting resinous compositions had been screen printed onto an insulating substrate or onto a metallic pattern already on substrate, as the substrate was heated to evaporate the solvent in the resinous composition, the resinous composition would further liquify. The printed resinous composition pattern would become extremely liquid and "bleed" or spread to cause poorly defined, fuzzy, pattern edges thereon. When such bleeding or spreading occurred, solder would not coat pattern edges which border lands and holes during the subsequent dip/wave solder operation.

Only after "bleeding" or spreading out of the printed pattern of the resinous composition would the resinous composition become polymerized and solidified (thermoset). This deficiency was attributable to the fact that in the curing step the resins would liquify before they hardened. During this liquification phase, the resinous composition further spread out to create a poorly defined pattern edge which borders areas where soldering is desired. Liquification of the resins during cured resulted in sloppy mask edges, i.e., the original print was sharp, but during cure the edges of the printed mask spread. Edges which are sharp and have not spread are quite important in high density boards, but not overly important in low density boards.

Prior art masking compositions were not very chemically resistant to adhesion promotion solutions such as chromic acid and highly alkaline, electroless copper baths used in the "fully additive" technique. Moreover, the prior art masking compositions were not smooth and produced rough coatings whose surfaces would be receptive to the production of adherent extraneous copper. With their use in making circuitry using the additive technique, unwanted spots of copper would appear on a background resist pattern for the reasons given hereinabove. Surface resistivity between conductors would be lowered unless the extraneous copper was removed by an extra step such as brushing.

Another problem unique to printed circuit boards is that the hardeners or curing agents used in prior art solder mask compositions stain gold deposits such as exposed tabs or fingers.

SUMMARY OF THE INVENTION

1. Objects of the Invention

It will be seen from the above that there is a need for permanent protective coating compositions for use in the manufacture of printed circuit boards, therefore, which are resistant to copper electroplating baths, adhere to insulating substrates, adhesive coated base materials, as well as metallic substrates, do not bleed when cured, are capable of withstanding the thermal shock of dip soldering and which maintain their gel-like structure over a long period of time when subjected to temperatures of about 160° C.

It is, therefore, an object of the present invention to provide permanent protective coating compositions for use in the manufacture of printed circuit boards.

An object of the invention to provide high resolution screen printable resists.

Another object of the invention is to provide an improved method of improving the resolution of conductive patterns on circuit boards.

An object of this invention is to provide an improved resist for screen printing of patterns on circuit boards.

It is also an object of this invention to provide a solid resin based protective coating useful in producing printed circuit patterns on a circuit board the patterns including lines and spaces having a resolution of at least 0.25 mm and as low as 0.1 mm.

An object of this invention is to provide a thermoset resin based protective coating the solid resin having a melting point between about 60° C. and about 200° C.

Another object of this invention is to provide a protective coating comprises of a blend of resins and solvents such that, during heat cure, the coating passes directly from a gel stage into a solid phase without liquifying.

Still another object of this invention is to provide a registered mask which, upon heat cure, retains its sharp edges and does not bleed over onto holes and lands surrounding the holes.

An object of this invention is to provide a thermoset resin based protective coating capable of adhering to adhesive coated base materials as well as metallic substrates, particularly copper substrates, and of withstanding the thermal shock associated with dip soldering.

An object of this invention is to provide a smooth, glossy protective coating which is not conducive to the formation of adherent extraneous copper in the additive method for producing circuit boards.

An object of this invention is to provide a protective coating which maintains an initial gel-like state and remains adherent to metallic substrates when heated for an extended period of time at a temperature of about 160° C.

An object of this invention is to provide a method of improving adhesion of organic coatings to copper substrates.

An object of this invention is to provide a protective coating which does not stain gold deposits such as exposed tabs or fingers on printed circuit boards.

Additional objects and advantages of the invention will be set forth in part in the description, or may be realized by practice of the invention, the objects and advantages being realized and attained by means of the methods, processes, instrumentalities and combinations particularly pointed out in the appended claims.

2. Description of the Invention

The protective coating compositions described in my U.S. application, Ser. No. 3,099, filed Jan. 3, 1979 and in my U.S. application Ser. No. 103,340 filed Dec. 6, 1979, both entitled "HIGH RESOLUTION SCREEN PRINTABLE RESISTS", respond, in part, to the aforementioned needs. Disclosed in such applications are resinous protective coating compositions useful in the manufacture of printed circuit boards having circuit patterns with a resolution of at least 0.25 mm lines and spaces thereon. The protective coating compositions each comprised a highly functional solid resin disclosed in a solvent, the resin having a melting point between about 60° C. and about 200° C. Each of the protective coating compositions initially constituted a liquid or soft gel, and when cured became a solid without bleeding. The present invention is considered to be an improvement on the invention discribed in my aforementioned U.S. applications, and its main features and objectives are thus similar to those of such aforementioned U.S. applications. It has been found that the protective coating composition of the present invention provides improved adhesion to metallic substrates and preserves its gel structure when heated over an extended period of time at a temperature of about 160° C., as described more fully hereinafter.

The present invention provides an improved means of bonding plastics to copper substrates, improved high resolution permanent screen printable, protective coatings, improved methods of producing printed circuit boards employing the improved protective coatings, and the improved circuit boards formed thereby. As will be clear from the following description, there is used in the manufacture of circuit boards of this invention certain resinous protective coating compositions which do not bleed when cured.

The protective coating composition of the present invention provides improved permanent coating or masks which are not subsequently removed. The additive technique and molten solder application steps employed in the manufacture of printed circuit boards each involve the application of such a permanent protective coating or mask. Various methods of producing printed circuit boards such as those described previously herein include the above-described steps and/or techniques and/or combinations thereof.

For illustrative purposes only and not intending the invention to be so limited, the application of the permanent protective coating composition of this invention is subsequently described herein in conjunction with a typical method (employing the additive technique) in the manufacture of printed circuit boards. The surface of an insulating substrate on which a printed circuit pattern is to be formed is coated with a permanent resinous protective coating or mask according to this invention. The mask has the characteristics of being able to resist attack by acids and alkali to which printed circuit boards will ordinarily be subjected in processing. The mask has a smooth, glossy surface. Holes defining crossovers have been preformed or may then be formed in the insulating substrate by any method which does not damage the mask or substrate materials surrounding the holes, such as by drilling, piercing or punching methods. A catalytic insulating blank such as the one described in U.S. Pat. Nos. 3,600,330 and 3,672,986 may be used as the insulating substrate. The board is contacted with a strong oxidizing solution such as chromic-sulfuric acid solution to adhesion promote the exposed or unmasked areas of the blank. Then the board is contacted with an electroless metal deposition solution to metallize the wells of the holes and the conductor pattern. In the next step, the insulating blank having circuit patterns electrolessly deposited thereon is printed with a permanent solder mask according to the present invention leaving the hole walls and if desired, lands surrounding the holes as well as finger areas, exposed. The permanent solder mask composition of this invention are capable upon curing, of forming a smooth, glossy surface which not only is resistant to the thermal shock of soldering but also is resistant to flux removing solvents. The permanent solder mask compositions of this invention adhere well to the metallic substrate (circuit pattern) even when subjected to temperatures of about 160° C. for about 16 hours.

A thermosetting resin in the protective coating having a high melting point and a high functionality permits the solvent in the protective coating to evaporate and the curing operation to occur without melting and liquifying the resin in the coating, thus avoiding spreading of the coating composition during the curing operation. It is believed that the viscosity of the protective coating composition increases as the thermosetting resin therein cures into a solid. The high functionality of the thermosetting resin also creates rapid crosslinking so that the printed mask pattern does not bleed or spread between lines or onto the lands and holes as maximum curing temperatures of the mask are reached. Consequently, the mask retains sharp edges.

It has been discovered that a thermosetting resin based screening mask capable of: (1) producing printed circuit patterns having a resolution of at least 0.25 mm lines and spaces on a substrate; (2) withstanding a copper plating bath; (3) adhering to adhesive coated base materials as well as to metallic substrates during extended heat treatment; and (4) withstanding the thermal shock of soldering and subsequent flux removal, is provided by a protective coating composition which comprises a highly functional thermosetting epoxy resin dissolved in a solvent and a preselected aliphatic hardener as the primary curing agent. The primary curing agent is corrosive to metals such as copper. The thermosetting epoxy resin is a solid at room temperature and does not melt at temperatures up to its curing temperature, typically between about 60° C. and about 200° C.

A simple test was devised to determine whether a particular solid thermosetting resin meets the criteria of the present invention. A chunk or sample piece of the thermosetting resin approximately 5-10 grams in weight is placed in an oven and heated to a temperature between 100° and 160° C. The resin sample is then removed from the oven and visually examined for indication of its melting or spreading. If the sample thermosetting resin melts or spreads during such heating test, it is not suitable for the present invention. On the other hand, if the thermosetting resin becomes and remains tacky during such heating test, it is suitable for the present invention.

The thermosetting epoxy resin of the present invention preferably comprises about 35-75% of the dry mask, the balance being curing agents and modifier(s). The highly functional thermosetting epoxy resin comprises more than about 10 weight %, preferably more than about 12 weight % of the protective coating composition of this invention. The highly functional thermosetting epoxy resin also comprises less than about 80 weight %, preferably less than about 60 weight % of the protective coating composition of this invention.

By highly functional thermosetting epoxy resins are meant those thermosetting epoxy resins having more than about 3 and less than about 10 functional groups, preferably between about 4 and about 7 functional groups. Suitable thermosetting resins are epoxy resins, and blends of epoxy resins having an average epoxide functionality between about 3 and about 6 and a melting point between about 60° C. and about 200° C.

Suitable epoxy resins include functional epoxy Novolac or bisphenol A type epoxy resins that exist normally as a solid at room temperature (having molecular weights between about 350 and 15,000) and have a melting point between about 60° C. and 200° C. For illustrative purposes, the subsequent discussion of the thermosetting resin based protective coatings of this invention will be directed to epoxy resin based protective coatings, but this is not intended to limit the scope of the invention thereto.

Preferred epoxy resins have an average epoxide functionality above 3 and include the following commercially available epoxy resins listed in Table I hereinbelow:

TABLE I

| Epoxy Resin | Average Epoxide Functionality | EEW* | Durran Softening Point | Manufacturer |
| --- | --- | --- | --- | --- |
| EPON 1031 | 4 | 220 | 178° F. | Shell Chemical Co. |
| ECN 1063 | 4 | 200 | 178° F. | Ciba Geigy Corp. |
| ENC 1273 | 3.8 | 225 | 73° C. | Ciba Geigy Corp. |
| ECN 1280 | 4.1 | 230 | 70°–80° C. | Ciba Geigy Corp. |
| ECN 1299 | 4.4 | 235 | 99° C. | Ciba Geigy Corp. |
| DEN 439 | 3.8 | 200 | 58° C. | Dow Chem. Co. |

*Average Epoxy Equivalent Weight

Other solid epoxy resins which are believed to be highly functional thermosetting resins within the scope of this invention include APOGEN 1013 (commercially available from Apogee Chemical Co.); EPI-REZ 521 having an average epoxy equivalent weight of 200 and a Durran softening point between 70° C. and 80° C. (commercially available from Celanese Corp.); EPI-REZ 5291 having an average epoxy equivalent weight of 310 and a Durran softening point between 90° C. and 95° C. (also commercially available from Celanese Corp.); and EPOTURF 37-171 having an average epoxy equivalent weight of 150 and a Durran softening point between 172° F. and 180° F. (commercially available from Reichhold Chemical Co.).

Other less functional epoxy resins may be optionally included in the coating composition to reduce the brittleness of the cured coating composition. Such epoxy resins include copolymers of epichlorohydrin (1-chloro-2,3-epoxy propane) which have melting points within the range of 70° C. to 191° C. and molecular weights of about 350 to 15,000. Although epichlorohydrin is the source of most important organic epoxides employed in the formation of the epoxy resins, other epoxides such as, for example, 1,2,3,4-diepoxy butane may be used. Moreover, while it is preferred to use epichlorohydrin in the preparation of the resinous polymeric epoxide of the present invention, other epihalohydrins such as epibromohydrin also may be used advantageously. Similarly, epoxy resins derived from phenols other than bisphenol A may be used including, for example, the reaction product of epichlorohydrin with resorcinol, with phenols derived from cashew nut oils, with hydroquinone, with 1,5-dihydroxy napthalene or with 2,2,5-tetrabis-(4-hydroxy phenyl)hexane. Phenolic intermediates of the resol type, hydrazines and sulfonamides, such as, for example, 2,4-toluene disulfonamide may also be used for reaction with an organic epoxide to product epoxy resins suitable for use. Aliphatic epoxy resins are suitable, including, for example, the reaction product of epichlorohydrin with glycerol, with ethylene glycol or with pentaerythritol.

The less functional modifier epoxy resins comprise up to about 30 weight %, preferably up to about 15 weight %, and when used typically comprise more than about 10 weight % of the protective coating composition of this invention.

The highly functional epoxy resin is dissolved with a suitable solvent to prepare a solution between about 50% and 90% by weight highly functional epoxy resin, and preferably about 70% by weight highly functional epoxy resin. Suitable solvents include glycol ethers and esters such as diethylene glycol ethyl ether, ethylene glycol ethyl ether, ethylene glycol methyl esters, acetates of the glycol ethers, secondary butyl acetate, normal butyl acetate, primary amyl acetate and the like.

The preselected primary curing agent or hardener suitable for the highly functional epoxy resin in the protective coating composition is an alicyclic amine which is corrosive to copper surfaces. The corrosive nature of such an amine to copper surfaces has in the past suggested that its use be avoided. Contrary to prior teachings, applicant has discovered that excellent adhesion of the protective coating compositions of this invention to copper substrates may be achieved with the use of alicyclic polyamine curing agents which are ordinarily considered corrosive to copper substrates.

Preferred alicyclic polyamine curing agents include methane diamine; 1,3-diamino-cyclohexane; isophorone diamine; triethylenediamine; and hexamethylenetetramine. The use of these preselected alicyclic polyamine curing agents in the protective coating compositions of this invention improved their heat resistance and adhesion to metallic surfaces.

Gelling agents may be added without impairing properties of the coating composition to improve antisag properties and screen printing techniques. When racking, storing and/or curing of the protective coating on the substrate in a substantially vertical orientation is contemplated, without the addition of the thickening or gelling agent, sagging of the printed image would occur. The thickening or gelling agent prevents sagging of the printed image during storage (particularly vertical storage) and/or heat curing. The addition of the thickening or gelling agent to the protective coating composition of this invention operates to improve the screen printing capabilities of the protective coating composition by thickening it, to a soft "gel-like" state.

This soft "gel-like" state can be described as being a non-Newtonian fluid which, when free-standing, does not flow. When a force is applied such as by a screen-printing squeegee, the flow occurs, and when such applied force is removed, the composition returns to its non-flowing, non-sagging state.

It has been found that when the alicyclic polyamines are employed by themselves as a curing agent in the protective coating compositions of this invention, resistance to flux removal processes may suffer. Examples of such flux removal processes are methylene chloride vapor degreasing and hot water scrubbing or brushing using machines.

In order to retain resistance to flux removal processes such as in methylene chloride vapor degreasing, it has been found that an aromatic amine should be included as a secondary curing agent in the curing agent composition. Preferred aromatic amines include tris-2-ethyl hexoate salt of tris(dimethylaminomethyl)phenol; diamino diphenyl sulfone; benzyl dimethyl amine; metaphenylene diamine; and methylene dianiline. This is because the aromatic amine cured epoxy resin system gives more rigid, heat and solvent resistant structures, as is well known.

Since the alicyclic polyamines are a strong base, the desired gel structure or thixotropic character necessary for smearless screen printing processes and which prevents sagging during storage in a vertical orientation also is lost about 5 minutes after the alicyclic polyamine is added to an epoxy resin solder mask composition, particularly when silica aerogels are used as thickeners.

To reduce or eliminate the basicity of the alicyclic amine in the protective coating composition of this invention, while retaining the thixotropic character of such protective coating composition, a number of preselected organic acids should also be included in the curing agent composition. These organic acids may be included in the resin system, the curing agent, or in the combination of the resin system and curing agent. Preferred organic acids include (a) carboxy terminated butadieneacrylonitrile polymers and carboxy terminated butadiene polymers; (b) fatty acids such as linoleic acid, oleic acid and the like; an example of such a fatty acid is a dimer or trimer fatty acid with two or three carboxylic groups per molecule produced by the polymerization of $C_{18}$ fatty acids such as (1) Empol 1040, a substantially trimer fatty acid (commercially available from Emery Industries, Inc., Cincinnati, Ohio 45202) having an acid value of 175–192, a saponification value of 192–200, and being 20% dimer acid and 80% trimer acid (2) Dimac S, a dimer acid (commercially available from Victor Wolf Limited, Manchester, England) having an acid number of 180–190, a saponification value of 192–198 and containing 8–10% monomer, 65–69% dimer, the balance, 26–30%, being higher polymers; and (c) dibasic acids such as adipic acid, glutaric acid, azelaic acid, sebasic acid and suberic acid.

Carboxyl terminated liquid acrylonitrile rubbers with or without pendant carboxyl groups form an amine salt with the basic alicyclic polymers. The reaction to the salt proceeds smoothly and quickly in a manner of minutes without external energy and with a slight, but noticeable exotherm occurring. The main benefit is maintaining gel. Other important benefits of using carboxyl rubbers are: (1) they provide toughening by reacting with the highly functional epoxy resin and (2) they eliminate or retard carbonate formation. Alicyclic polyamines such as methane diamine will, by themselves, on prolonged standing in air, absorb carbon dioxide from the air to form a useless white carbonate salt.

In preparing a permanent protective coating according to the present invention, an amount of curing agent is employed which is sufficient to completely cure the highly functional epoxy resin in the protective coating. This may be calculated according to the amine equivalent weight (A.E.W.) of the curing agent and the epoxy equivalent weight (E.E.W.) of the epoxy resin according to the formula:

$$\text{Weight of hardener (curing agent)} = \frac{A.E.W.}{E.E.W.} \times \text{weight of epoxy resin.}$$

Various modifiers are added to the epoxy resin-solvent solution to improve flow, screenability, to increase toughness and optionally to impart color, antioxidation and antisag properties.

Flow promoters (or flow control agents) prevent "fish eyes" from forming in a screening mask by lowering surface tension to provide a smooth, continuous surface. As indicated in N. I. Gaynes et al., *Formulation of Organic Coatings* (D. Van Vostrand Co. 1967) pp. 184–185, 294–295 and 300–301, resin films tend at times to crater or pinhole. A flow promoter helps to provide a smooth, homogeneous film, without the unsightly craters and "orange peel" effect normally developed with the use of these resins. Examples of suitable flow promoters include alkyl acrylate polymers and silicones. Preferred commercial flow promoters are MODAFLOW (commercially available from Monsanto Chemical Co., St. Louis, Mo.); RAYBO 15 (commercially available from Raybo Chemical Co., West Virginia), and DC 840 (commercially available from Dow Corning Co., Midlands, Mich.). MODAFLOW is a high molecular weight polymer believed to be a blend of isobutylacrylate and ethyl acrylate polymers or a copolymer thereof which is commercially available from the Monsanto Chemical Co., St. Louis, Mo. MODAFLOW enhances the surface leveling properties of the composition such that the composition when applied to the insulating or conductive bases flows out to a smooth level without forming ripples or bubbles, so that on drying, it produces a smooth, glossy surface. The flow promoters comprise up to about 6 weight %, preferably up to about 4 weight % and when used, typically comprise more than about 1 weight % of the protective coating composition of this invention.

Screening aids act as a lubricant, facilitating screen printing of the highly functional epoxy resin containing coating compositions of this invention to produce smooth coatings. Suitable screening aids include epoxy resins which are liquid at room temperature. Preferred commercially available epoxy resins include DER 330, DER 331 and DER 332 (all commercially available from Dow Chemical Co., Midlands, Mich.); EPON 820 (commercially available from Shell Oil Company, New York, N.Y.); EPOTUF 37-151, EPOTUF 37-134, EPOTUF 37-135, EPOTUF 37-250 (all commercially available from Reichhold Chemical Co., White Plains, N.Y.), EPI-REZ 508 and EPI-REZ 510 (commercially available from Celanese Corp., New York, N.Y.), and ARALDITE 6005 and ARALDITE 6010 (commercially available from CIBA-GEIGY CO., Ardsley, N.Y.). The screening aids comprise up to about 60 weight %, preferably up to about 40 weight % and when used, typically comprise more than about 1 weight %, preferably more than about 2 weight % of the protective coating composition of this invention.

Suitable tougheners include the liquid acrylonitrile butadiene copolymer rubbers and solid epoxy resins with high epoxy equivalent weights. The rubber tougheners precipitate out during curing as, for example, rubber-rich microglobules uniformly dispersed throughout the cured polymer. The microglobules stop crack propagation from occurring in the cured polymer. Preferred rubber tougheners include the following commercially available liquid, monomeric, reactive rubbers: CTB, CTBN, CTBNX and ATBN (commercially available from B. F. Goodrich Chem. Co., Cleveland, Ohio). The solid epoxy resin tougheners toughen the protective coating composition by flexibilizing the cross-linked rigid structure. Preferred epoxy resin tougheners include the following epoxy resins listed in Table II which are solid at room temperature with epoxy equivalent weights greater than 350.

TABLE II

| Toughener Resin | EEW | Softening Point | Manufacturer |
| --- | --- | --- | --- |
| DER 661 | 475-575 | 70-80° C. | Dow Chemical Co. |
| DER 667 | 1600-2000 | 113-123° C. | Dow Chemical Co. |
| Epon 1001 | 450-550 | 65-74° C. | Shell Chemical Co. |
| Araldite 7097 | 1650-2000 | 113-123° C. | Ciba-Geigy Corp. |

The tougheners comprise up to about 10 weight %, preferably up to about 7 weight % and when used, comprise more than about 1 weight % of the protective coating composition of this invention.

Suitable color agents (pigments) include the following commercially available pigments: Cyan Green B-15-3100 (Blue Undertone), Cyan Green Y-15-3040 (Yellow Undertone), and Titanium dioxide (Rutile) OR-600 (all commercially available from American Cyanamid, Wayne, N.J. 07470); Irgazin Yellow 2GLT (commercially available from Ciba-Geigy Corp., Ardlsey, N.Y. 10501); and Monastral Red RT-79D and Blue BT 417 (commercially available from E. I. duPont de Nemours, Wilmington, Del. 19899).

Antioxidants can optionally be included in the protective coating composition of this invention as a modifying agent when continuous use of the cured coating at temperatures above about 100° C. is contemplated. The antioxidants prevent excessive air oxidation of the coating composition in such usage. Excessive air oxidation would otherwise cause the coating composition to become discolored. Brittleness and loss of adhesion to a substrate to which it is coated are also avoided.

Suitable antioxidants include thioesters such as dialkyl thiodipropionate, dilauryl thiodipropionate, distearyl thiodipropionate, and dimyristyl thiodipropionate; phosphites such as tris (nonylphenol) phosphite and alkaryl phosphite; and phenolics such as fatty acid modified substituted phenolics, phosphited hindered phenolics and high molecular weight hindered phenolics (e.g. butylated hydroxy toluene); and mixtures thereof. Preferred antioxidants include a combination of a thioester with a hindered phenolic in a ratio by weight of 9 to 1 hindered phenolic to thioester. The antioxidants comprise more than about 1 weight %, preferably more than about 3 weight %, less than about 10 weight %, preferably less than about 7 weight % of the protective coating composition of this invention.

Suitable thickening or gelling agents include a fumed silica having particles of submicroscopic size with a total surface area of 200 to 400 square meters per gram such as Cab-O-Sil (commercially available from Cabot Corporation, Boston, Mass.); organic modified montmorillonite clays such as Bentone 27, a trialkylaryl ammonium smectite and Bentone 38, a tetraalkyl ammonium smectite, an amine treated bentonite (both Bentones are commercially available from NL Industries, 1230 Sixth Avenue, New York, N.Y.); a colloidal silica made according to the disclosures of U.S. Pat. Nos. 2,574,902 and 2,577,485 such as Ludox (commercially available from E. I. duPont de Nemours & Co., Wilmington, Del.); a silica aerogel having particles of small microscopic size with a total surface area of 280 $m^2/g$ such as SANTOCEL Z (commercially available from Monsanto Chemical Co., St. Louis, Mo.).

The thickening or gelling agent comprises up to about 5 weight % and when employed, typically comprises more than about 1 weight %, preferably more than about 2 weight % of the epoxy resin solids content of the protective coating composition of this invention. Upon curing of the protective coating composition containing the thickening or gelling agent, the "gel-like" composition remains in its soft "gel-like state" until it is fully cured and solidified in situ without bleed, flow or sag occurring.

Fumed silica may also be added to the primary curing agent to provide it with body and pourability with less splashing. The advantage of such admixture is the minimization of potential weighing errors which may occur when the primary curing agent composition is added to the protective coating composition of this invention.

The apparent viscosity of the epoxy resin screen printable mask is between about 10,000 centipoise and about 200,000 centipoise, preferably between about 15,000 and about 100,000 centipoise. For purposes of control, the apparent viscosity of the gels of this invention are measured with the Brookfield Viscometer at 10 RPM with a No. 7 spindle.

As will be clear from the following description, use of the permanent protective coatings of the present invention eliminates bleeding upon cure of the coatings and therefore eliminates the problems concomitant with the use of resinous masking compositions which bleed or spread when cure Also important is the fact that the use of these permanent protective coatings leads to the achievement of high resolution at the edges of the coatings, a result not possible with conventional masking compositions. Consequently, improved high density printed circuit boards may be produced by various methods of producing circuit boards which involve the use of the improved permanent protective coatings of this invention.

Other objects and advantages of the invention will be set forth in part herein and in part will be obvious herefrom or may be learned by practice with the invention, the same being realized and attained by means of the instrumentalities and combinations pointed out in the appended claims.

The invention is more fully described hereinafter with reference to the accompanying drawings which illustrate certain embodiments of the invention and together with the specification serve to explain the principles of the invention.

Figure 9:
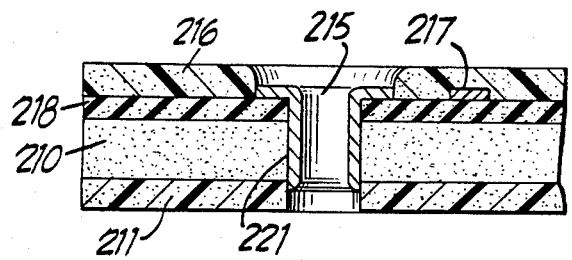
Figure 10:
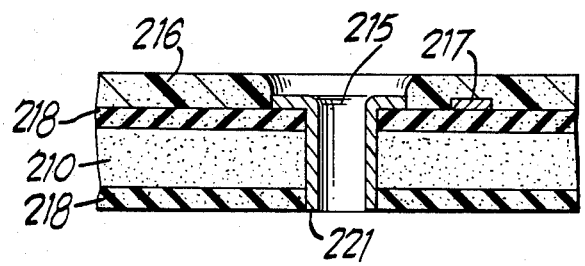
Figure 11:
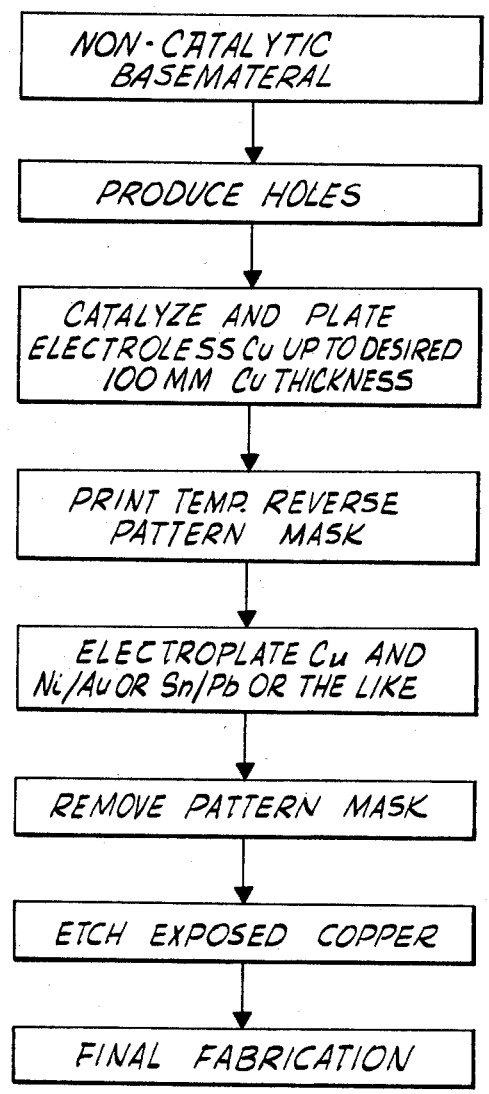
Figure 12:
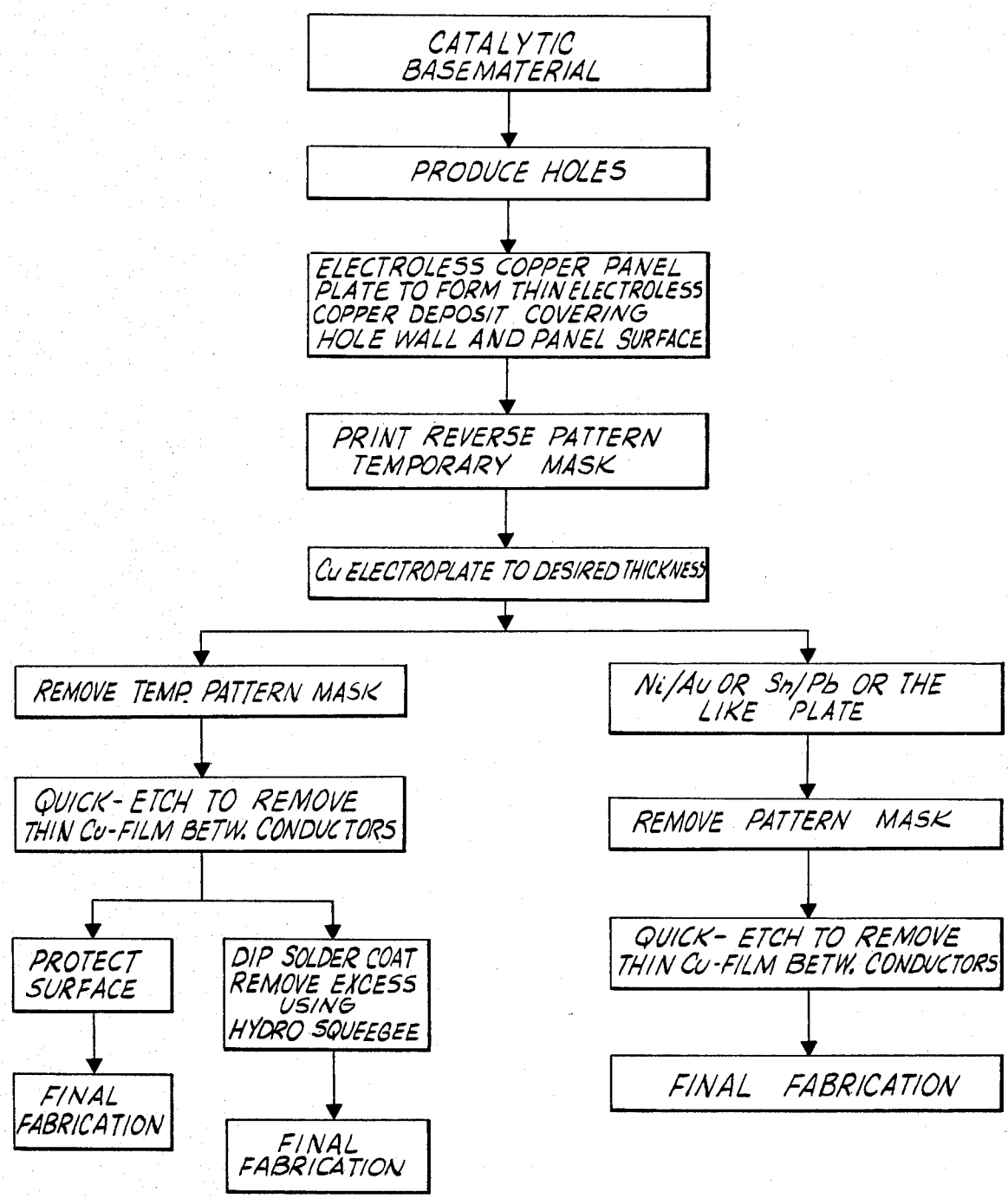
Figure 13:
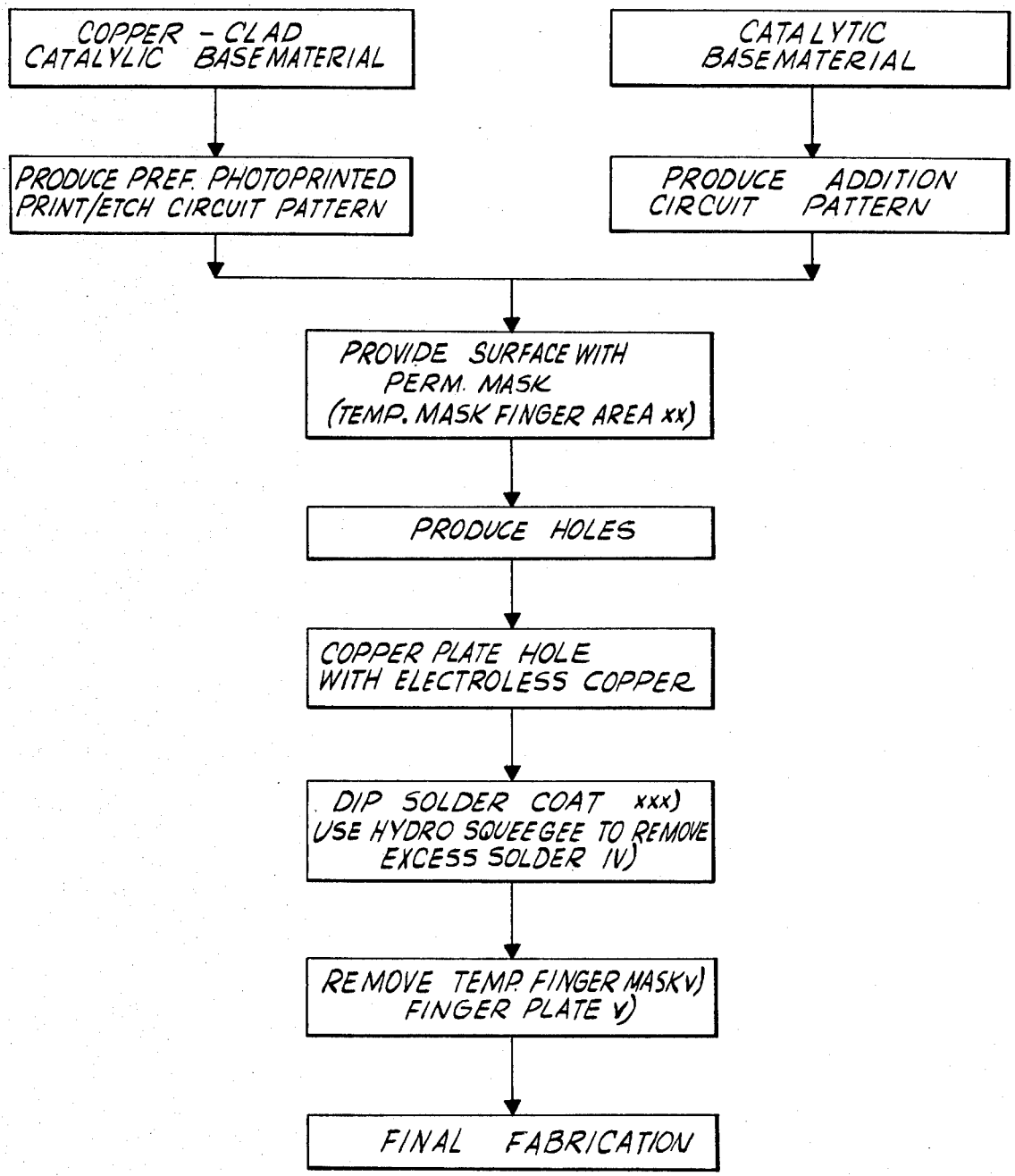

FIGS. 1–10 illustrate procedures which can be used to produce printed circuit boards from insulating substrates and for alternative embodiments of printed circuit boards produced in accordance with the teachings herein; and FIGS. 11–13 are flow sheets illustrating typical procedures for making printed circuits following the teachings of this invention.

In the drawings, similar reference numerals are used to represent similar parts.

A method for making printed circuits using an insulating substrate 10 is illustrated in FIG. 1. As shown in FIG. 1A, the insulating substrate 10 has bonded thereto metal layers 12 and 14 on both sides of substrate 10. The metal layers 12 and 14 typically are copper. In FIG. 1B, hole 15 is drilled through the copper clad substrate 10. The substrate 10 is then immersed in a palladium-tin chloride solution to apply a thin film of catalyst 18 in hole 16 as shown in FIG. 1C. Copper is then electrolessly deposited, by methods well known in the art, through the hole 16 to form a copper conductive film 20 about 1 micron thick on the walls of the hole 16, as shown in FIG. 1D. In FIG. 1E, there is shown a temporary mask 22 comprised of an alkaline strippable resist such as ER 3057 resist (commercially available from Colonial Printing, Inc. Company, 180 East Union Avenue, Rutherford, N.J. 07073) which has been screen printed in a negative pattern. Copper 24 is electroplated and then solder 26 is plated onto the exposed hole 16 and conductor 21 (FIG. 1F). The temporary mask 22 is then stripped with a hot alkaline solvent and the copper layers 12 and 14 are etched with ammonium persulfate or ammonical copper chloride solution (FIG. 1G). A permanent solder mask 30 according to the present invention may be then applied over the circuit lines, leaving hole 16 exposed (FIG. 1H).

Alternatively, to remove the solder from underneath the solder mask, the solder can be stripped from the board with hydrogen peroxide and hydrochloric acid solution before applying the solder mask.

In order to preserve adhesion of the mask of this invention to copper, diamines, aromatic diamines such as p-phenylene diamine, aryl amines, hindered phenols such as butylated hydroxy toluene, and thioesters such as dialkyl thio-dipropionates may be employed.

A method for making printed circuits using a catalytic insulating substrate is illustrated in FIG. 2. As shown in FIG. 2A, a catalytic insulating substrate 100 has bonded thereto metal layers 102 and 104. In its simplest form, the substrate 100 has distributed therein an agent (not shown) which is catalytic to the reception of electroless metal from an electroless metal deposition solution. Hereinafter, whenever the term "catalytic" is employed it will refer to a material which has this property, i.e., the ability to receive a metal deposit when exposed to an electroless metal deposition solution, or to catalyze the deposition of metal from such a solution. The catalytic agent may be dissolved in or dispersed throughout the substrate 100. Alternatively, the insulating base metal, e.g., the insulating base material may be formed in whole or in part of an insulating organometallic compound which is catalytic to the reception of electroless metal. Superimposed on the substrate 100 and adhered thereto are thin unitary and integral metal layers 102 and 104 which preferably cover and are substantially conterminous with, i.e., each have the same boundaries as, the surface of substrate 100. The thickness of the metal layers 102 and 104 will depend primarily upon the manner in which they are fabricated and bonded to the substrate 100, and will also depend upon the ultimate use to which the substrate is to be put. Typically, the metal layers 102 and 104 will have a thickness of between about 0.05 micron and 105 microns. In a preferred embodiment, the metal layers 102 and 104 are copper. The thickness of the metal layers 102 and 104 when made of copper will preferably be such that their weight will vary between about 0.03 and 2 ounces per square foot.

When the metal layers 102 and 104 are superimposed on the substrate 100 by means of conventional metal cladding techniques, i.e., by preforming a thin foil of metal, e.g., byn electrolytic deposition, and laminating it to the base, the foils 102 and 104 will each have a thickness of at least about 8 microns. On the other hand, if the metal layers are produced by vapor deposition or by the electroless chemical metal deposition technique described herein, they can be as thin as 0.05 micron.

Figure 2A:
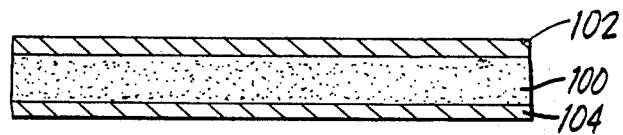
Figure 2B:
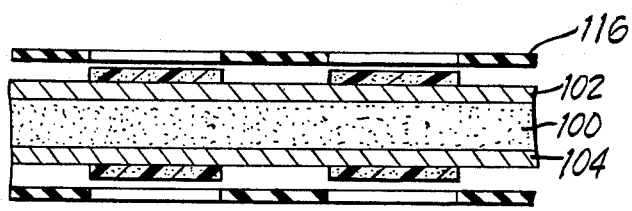
Figure 2C:
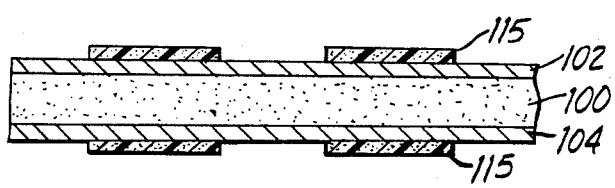
Figure 2D:
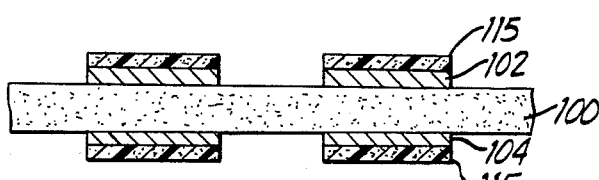
Figure 2E:
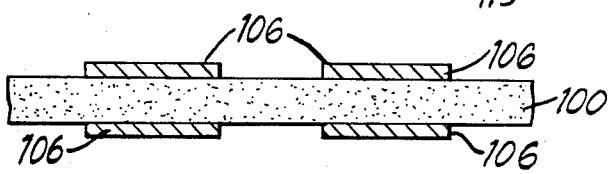

Using a print and etch technique of the type described hereinbelow, circuit 106 is imposed on the catalytic substrate 100. In FIG. 2B, a positive pattern of the desired circuit is made on the surface of the substrate 100 by printing a positive pattern of the desired circuit on each surface by means of a screen stencil step and repeat negative 116 with an acid resistant material 115, such as In FIG. 2C, the metal on both surfaces in the area not covered by the mask is ready to be etched to remove the metal foil 102, 104 and form a conductor pattern 106 shown in FIG. 2D. Following etching, the resist 115 is removed to leave conductor pattern 106 adhered to substrate 100 as shown in FIG. 2E. The printed pattern may be formed on the metal clad substrate 100 in a variety of ways.

In screen printing, the step and repeat negative is used to produce a stencil on the silk or wire mesh of the screen frame. The stencil is made photographically from a negative and reproduces it exactly.

It will be understood that either a positive or a negative image of the desired conducting patterns may be imposed on the substrate, with suitable modifications to insure that the final conductive pattern desired is ultimately obtained.

When screen stencil printing is employed, the ink used in printing must be acid resistant, so that the portions of the metal foil covered thereby are not affected by the etching solution when the plate is contacted therewith.

One etching solution commonly used with copper clad stock is ferric chloride. The etching operation is carried out by either blasting the surface of the panel with a fine spray of ferric chloride or immersing the printed sheets, which are held in a rack or on a conveyor, in an agitated tank of ferric chloride. The etching operation is controlled by the concentration of the etching solution and time of contact, and these variables must be carefully controlled empirically for good results. After etching, a water rinsing process is employed to remove all etching chemicals, thereby preventing contamination of the surface or edges of the panel.

Figure 2F:
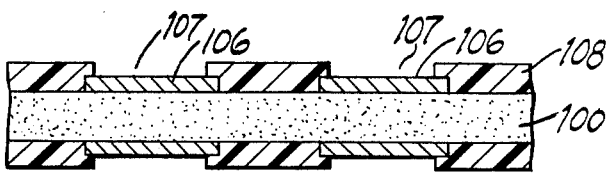
Figure 2G:
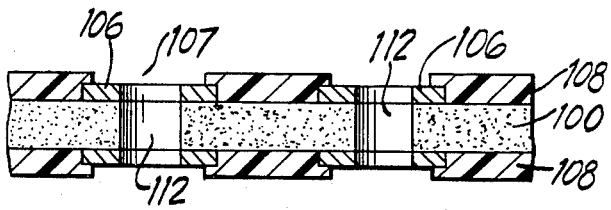
Figure 2H:
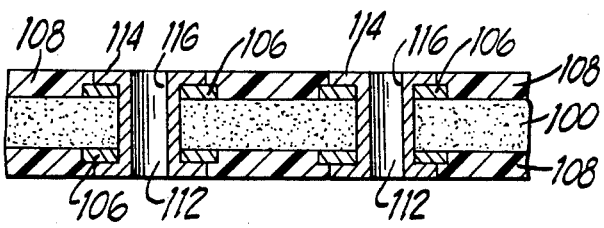
Figure 3A:
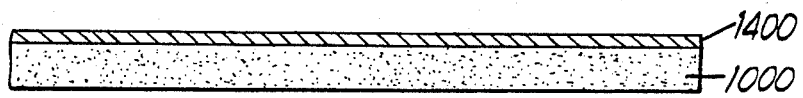
Figure 3B:
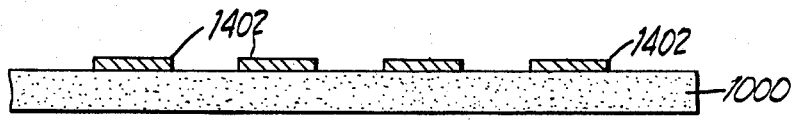
Figure 3C:
Figure 3D:
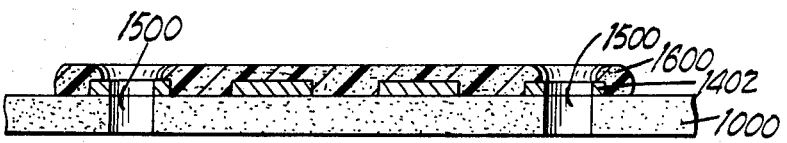
Figure 3E:
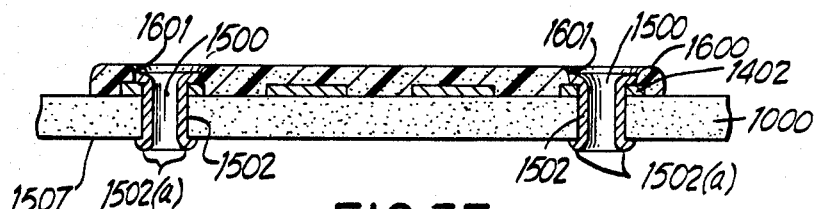
Figure 4:
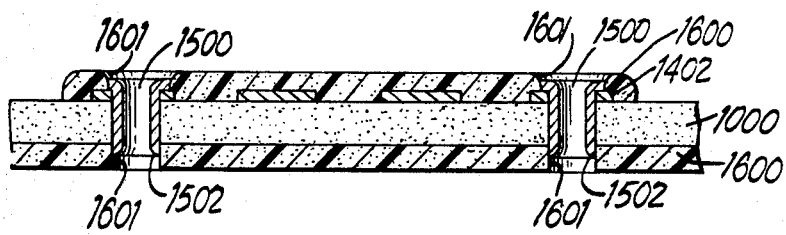

Frequently, a bare copper foil circuit is not adequate. If, for example, the circuit pattern is to be used as a switch, slip ring, or commutator, it may be necessary to plate the circuit pattern with silver, nickel, rhodium, gold and similar highly wear resistant metals. Where it is necessary to solder lugs or other hardware to the pattern, it may be advisable to have the conductor pattern solder plated. In FIG. 2F the circuit 106 is coated with a permanent solder mask 108 according to this invention to leave exposed lands 107 defining interconnecting points between the circuits. In FIG. 2G, holes 112 are provided in the lands 107. The circuit board as it looks in FIG. 2G is then exposed to an electroless metal deposition solution of the type described herein to deposit electroless metal 116 on the walls surrounding the holes as shown in FIG. 2H. In an alternative embodiment, the solder mask shown in FIG. 2G, could cover the entire circuit pattern with the exception of the holes per se. When the resulting base is exposed to electroless metal, the walls of the holes would be plated but there would be no lands exposed. The embodiment of FIG. 2, including the alternative suggested, represents a preferred commercial process for practicing the invention described herein. FIG. 2 described supra illustrates an important embodiment of the invention which can be used to good advantage in the production of high density printed circuit boards.

When the circuit density is high, it is extremely difficult to print a registered solder mask so as to leave the lands surrounding holes exposed, for the simple reason that little free space not covered by conductor lines or not taken up by holes is available on the surface of the board. For this reason, holes constitute a serious limiting factor on the density of printed circuit boards made conventionally. Even when great precautions are taken in printing the solder mask on high density circuit boards of the type described, there is a good possibility of the masks breaking down in part, thereby causing the solder to bridge from one land to another, which in turn results in short circuiting of the finished board, or the solder mask may block the holes, thereby preventing proper soldering.

By utilizing the registered mask of this invention shown in FIG. 2, high density printed circuit boards are facilitated. As shown in FIG. 2, A–F, there is first produced a printed circuit pattern 106 on a suitable insulating substrate 100. As described with respect to FIG. 2G, the circuit pattern may be then covered completely with a solder mask 108 with the exception of holes defining cross-over points which extend through the mask and the board. As shown in FIG. 2H, the hole is next metallized by a suitable technique such as described in U.S. Pat. No. 3,269,861 or U.S. Pat. No. 3,259,559 to provide a metal coated wall. The completed circuit board within this embodiment takes the form shown in FIG. 2H. When the circuit board of FIG. 2H is subjected to a solder bath, solder deposits only on the electroless metal deposit 116 on the walls surrounding holes 112. The mask 108 insures that no solder deposits on the surface of the circuit board itself. The solder mask of this invention substantially eliminates any possibility of solder bridging or mask blocking the holes, regardless of how close the holes or how high the circuit density.

As will be appreciated, this technique permits the holes and lines to be placed close together, thereby enabling a high density circuit pattern to be produced, and also minimizes or eliminates the possibility of solder bridging.

A wide variety of additional circuit boards may be produced using the permanent mask of this invention.

In its simplest form, this technique can be used to provide a one-sided plated through hole circuit board following the technique illustrated, for example, in FIG. 3. In FIG. 3A is shown a blank which comprises a catalytic substrate 1000 having bonded thereto a thin film of metal 1400. In FIG. 3B, a circuit pattern 1402 has been produced on base 1000 by following the print and etch principles described hereinabove. In FIG. 3C the lines of the circuit pattern 1402 have been covered with a permanent solder mask 1600 according to the present invention leaving the pads 1402 exposed. In FIG. 3D holes 1500 are then provided in the board. The holes can be put in the board before or after forming the pattern 1402 or before or after application of the mask 1600. In FIG. 3E, the board has been subjected to an electroless metal solution to deposit a coating of electroless metal 1502 on the walls surrounding the holes 1500. When subjected to a solder bath, the board of FIG. 3E will not receive solder on the portion of the mask edge 1601 surrounding the holes which is adjacent the surface of the mask. Note, however, that the lower surface 1507 of catalytic substrate may accept on occasion unwanted electroless metal deposits.

To avoid the formation of such deposits on the bottom surface, a permanent resin mask 1600 according to the present invention could be superimposed on both surfaces of the board to enhance the insulating characteristics of the board. Such one-sided circuit boards would have the appearance shown in FIG. 4. Here again, the smooth, glossy, protective coating of the mask will prevent unwanted deposits on the lower surfaces surrounding the holes.

The technique for producing two-sided plated through hole boards utilizing this permanent resin mask concept has already been illustrated in FIG. 2.

It will be appreciated that in the FIG. 2 embodiment, the original circuit pattern 106 shown in FIG. 2C could, if desired, be produced by the additive technique described hereinabove, rather than the print and etch technique. Similarly, in FIGS. 3 and 4, the original circuit pattern 1402 could be produced by the additive technique as distinguished from the print and etch technique.

In FIG. 5 is shown a way in which multilayer plated through hole boards could be used utilizing the permanent resin mask concept described hereinabove. In FIG. 5A is shown a blank comprising a catalytic substrate 1000 having superimposed thereon a thin metal film 1200.

Figure 5A:
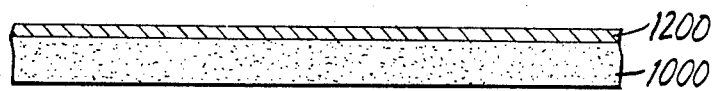
Figure 5B:
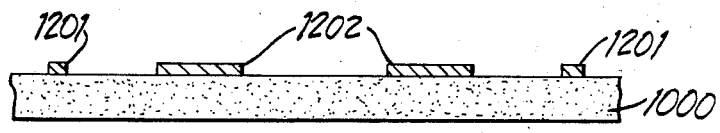

In FIG. 5B, a printed circuit pattern 1202 has been formed on the catalytic substrate 1000 utilizing a print and etch technique.

Figure 5C:
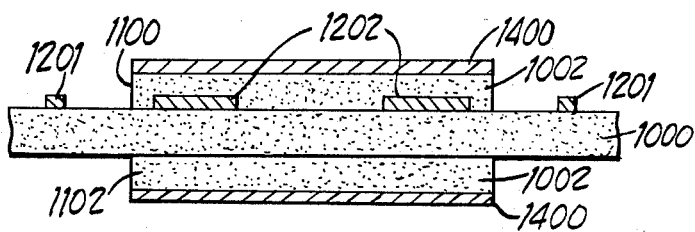
Figure 5D:
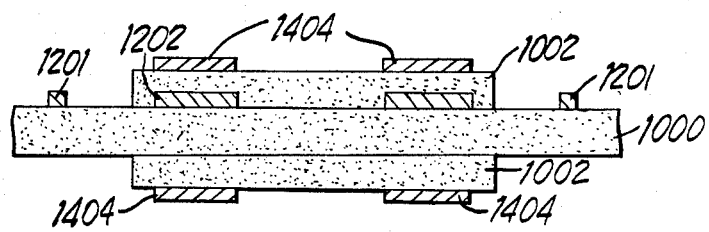
Figure 5E:
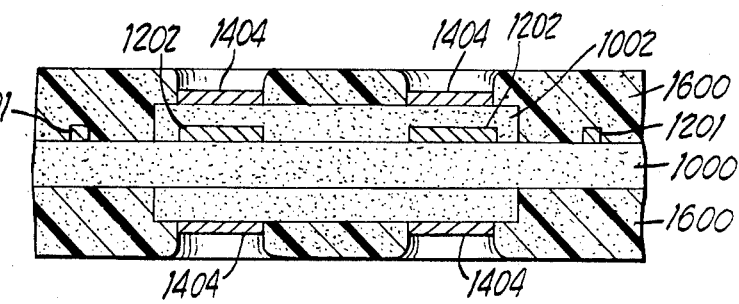
Figure 5F:
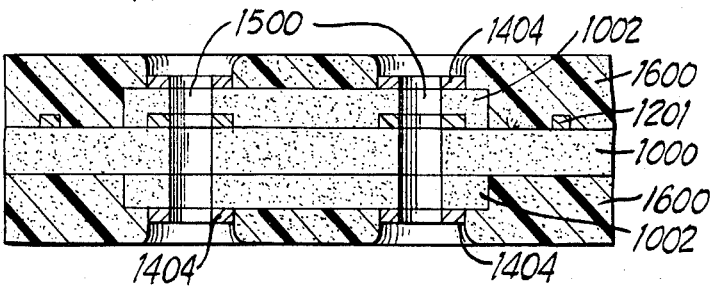
Figure 5G:
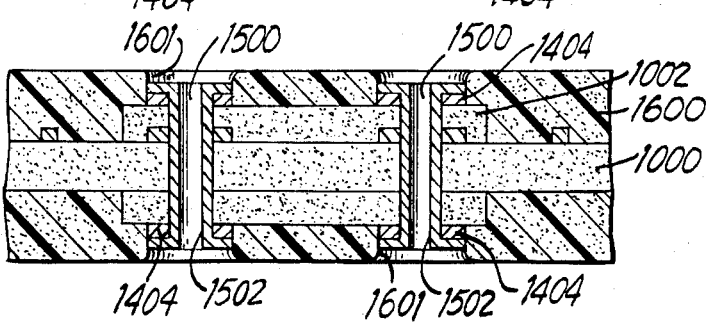

In FIG. 5C, there has been superimposed upon the circuit pattern 1202 a catalytic blank 1100 comprising a catalytic substrate 1002 and a thin metal film 1400. A similar catalytic blank 1102 has been superimposed on the bottom layer of the catalytic substrate 1000 as is also shown in FIG. 5C. In FIG. 5D, additional circuit patterns 1404 have been formed on the top and bottom catalytic substrate layers 1002 using a print and etch technique. As shown in FIG. 5E, the circuit pattern top and bottom is next coated with a permanent solder mask 1600 according to the present invention. Next, holes 1500 are provided in the circuit board as shown in FIG. 5F. Finally, the board is subjected to an electroless metal deposition solution to deposit electroless metal 1502 on the walls surrounding holes 1500, as shown in FIG. 5G.

The finished circuit board could then be solder plated, for example, by immersing in a solder bath to coat the walls of holes 1500 with solder, if desired.

In a further refinement of the embodiment shown in FIG. 5, suitable indicia at 1201 could be superimposed or provided on the substrate 1000, preferably prior to lamination of the metal clad blanks shown broadly at 1100 and 1102. These indicia could then be used as bull's eyes for pattern registration during printing of the circuit patterns on metal layers 1400. The bull's eyes 1201 may take a variety of forms. Thus, for example, they could be holes boarded or otherwise provided in the substrate 1000 which could serve as a ground plane or a support for an actual circuit pattern, or both. Alternatively, bull's eyes 1201 could take the form of a metal spot or dot produced either by the print and etch or additive technique described herein.

It should also be brought out that the initial circuit pattern 1202 need not be formed on the ground plane or substrate 1000 by print and etch techniques. Similarly, the metal clad blanks 1100 and 1102 in FIG. 5 could if desired be replaced simply by a catalytic base, following which the circuit patterns 1404 could be made by the additive technique rather than the print and etch.

In FIG. 6 is shown still a further embodiment for producing multi-layer boards utilizing the registered printed solder mask concept.

Figure 6A:
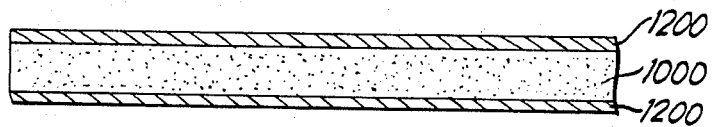
Figure 6B:
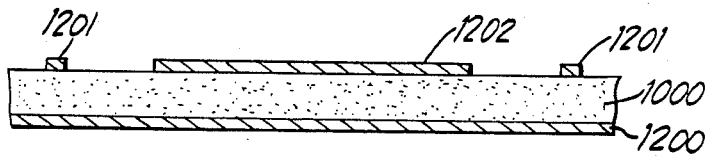

In FIG. 6A is shown a blank comprising a catalytic substrate 1000 having superimposed on both surfaces thin metal films 1200.

Figure 6C:
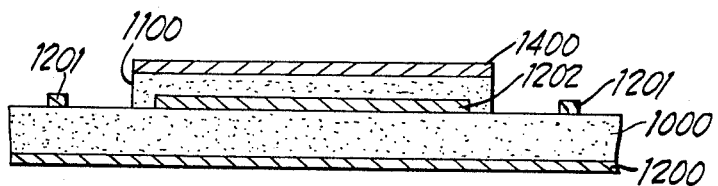

Using a print and etch technique, a circuit or ground pattern 1202 is formed on the substrate 1000. Here again, if desired, bull's eyes or registration marks 1201 may be formed on the substrate 1000 simultaneously with production of the first printed circuit or ground pattern 1202. In FIG. 6C a catalytic blank 1100 comprising a catalytic substrate 1000 and a thin metal film 1400 has been superimposed on circuit pattern 1202 and laminated to the catalytic substrate 1000.

Figure 6D:
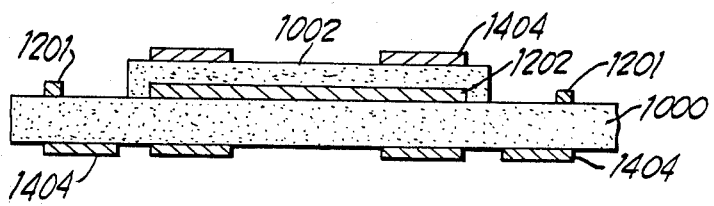
Figure 6E:
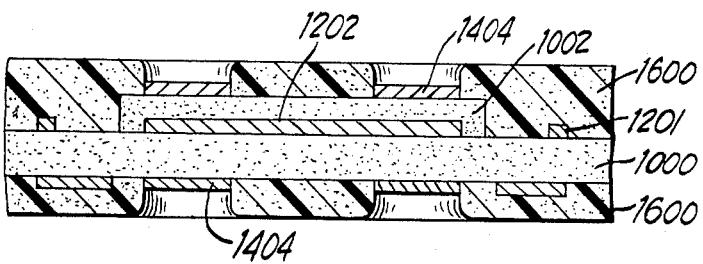

Using print and etch techniques, a circuit pattern 1404 is formed on the surface of substrate 1002 and on the lower surface of ground substrate 1000 as shown in FIG. 6D. In FIG. 6E, a permanent registered mark 1600 according to the prevent invention is superimposed on circuit pattern 1404 so that the resulting three-layered board appears as shown in FIG. 6E.

Figure 6F:
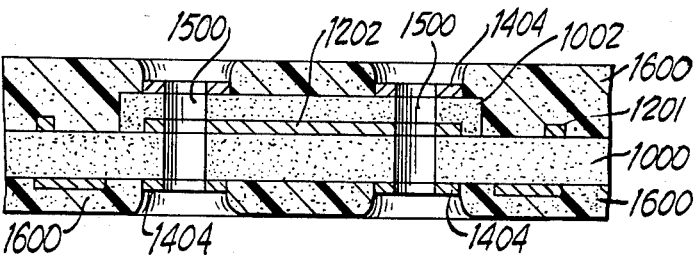
Figure 6G:
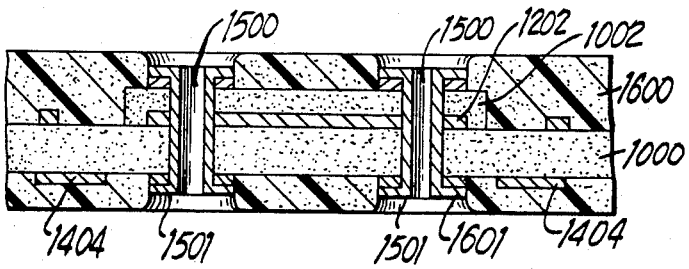

In FIG. 6F holes 1500 are provided in the board, following which the board is subjected to an electroless metal deposition solution to deposit metal on the walls surrounding the holes. The finished three-layer circuit board is shown in FIG. 6G, wherein 1501 refers to the metal surrounding the walls of the holes.

In FIG. 6, circuit pattern 1202 need not be formed by the print and etch technique. Rather, it could be formed by the additive process described herein. Similarly, blank 1100 need not be a metal clad blank but could simply consist of a catalytic substrate. In such an embodiment, circuit patterns 1404 could also be produced by the additive technique.

In FIG. 7 is shown a particular important embodiment of the invention wherein a four-layer plated throughhole circuit board containing a registered permanent solder mask is produced. In FIG. 7A is shown a blank comprising a substrate 1000 having superimposed thereon thin metal films 1200. In FIG. 7B print and etch circuit patterns 1202 are formed on the top and bottom layer of the ground plane 1000. At 7C, blanks 1100 and 1102 are laminated top and bottom to the substrate 1000 and cover the circuit patterns 1202. Blank 1100 and 1102 comprise a catalytic substrate 1002 and a thin metal film 1400.

Figure 7A:
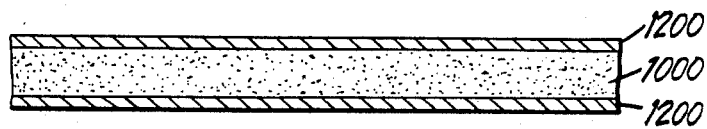
Figure 7B:
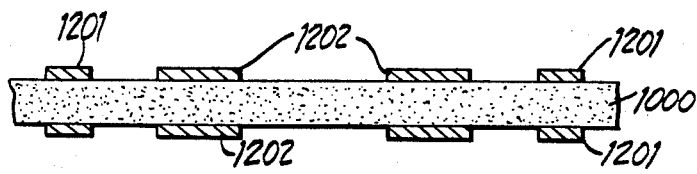
Figure 7C:
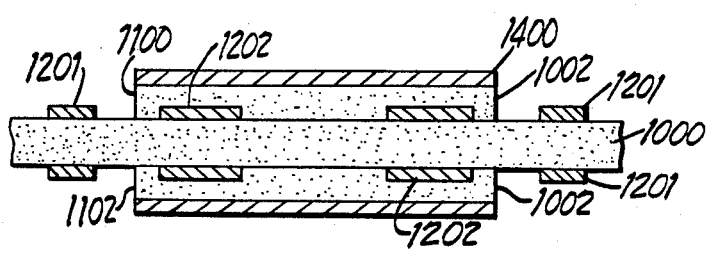
Figure 7D:
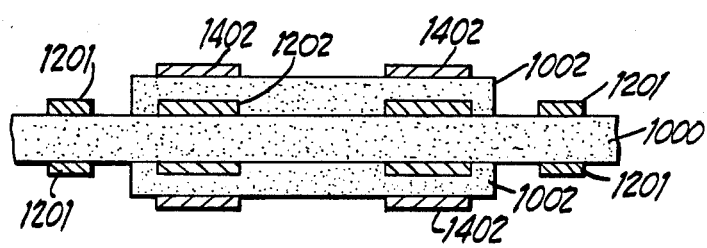
Figure 7E:
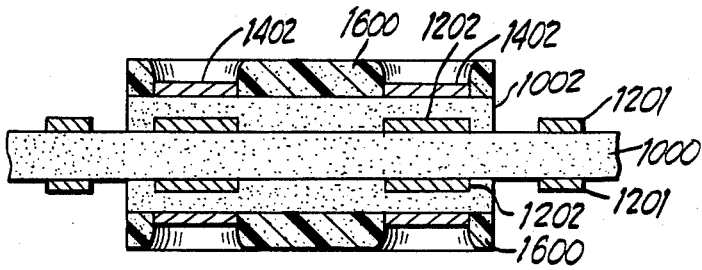

In FIG. 7D, additional circuit patterns 1402 are formed top and bottom by print and etch techniques. Here again, bull's eyes or registry marks 1201 may be used if desired for registration purposes in forming the circuit patterns 1402. In FIG. 7E a permanent registered solder mask 1600 according to the present invention is coated over both the top and bottom surfaces on the board.

Figure 7F:
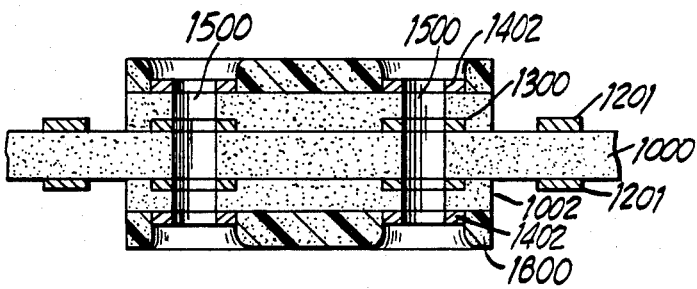
Figure 7G:
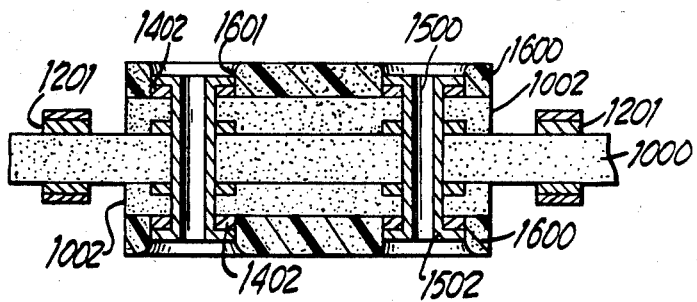

Next, holes 1500 defining cross-over points are provided in the board shown in FIG. 7F. Then the board is subjected to electroless metal deposition to deposit metal in the walls surrounding the holes is shown in FIG. 7G. Here again, in the FIG. 7 embodiment, it is not necessary to form the circuit patterns 1402 and 1202 by print and etch techniques. Rather, each of these circuit patterns could be produced using the additive technique described herein. In such embodiments, the metal cladding 1200 and 1400 would be eliminated.

Figure 8:
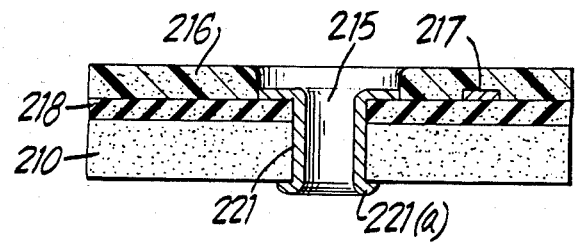

In FIG. 8, 210 is a catalytic substrate and 218 is a catalytic adhesive superimposed on the substrate 210. Numeral 117 represents the printed circuit pattern and 216 represents the permanent solder mask according to the present invention. In FIG. 8, the wall of hole 215 has a deposit of metal 221 to make a through connection. Note that the plating on the hole wall extends over the edge of the board at the lower surface to form a small exposed eyelet 221(*a*).

To avoid the formation of eyelets 225(*a*) on the lower surface, that surface could be coated with a permanent or nonpermanent mask as shown in FIG. 9.

In FIG. 9 is shown a plated through hole formed utilizing the registered permanent resin mask concept. In FIG. 9, the board comprises a catalytic base 210, the lower surface of which comprises an insulating resinous layer 211. On the upper surface, the base 210 is coated with a layer 218 of catalytic adhesive material on which has been formed the printed circuit pattern 217. A permanent resin mask 216 according to the present invention covers the circuit pattern completely. Hole 215 has its walls covered with metal 221, which terminates short of the outer surfaces of masks 216 and 211.

In FIG. 10 is shown a plated through hole board. The board of FIG. 10 comprises a catalytic base 210 having superimposed thereon layers of catalytic adhesive 218. Printed circuit pattern 217 is formed on the upper surface of adhesive 218. Permanent solder mask 216 according to the present invention covers the entire circuit pattern. Hole 215 has a plated wall 221. Here the plated wall extends to the lower surface of the board. In FIG. 10, the electroless metal layer 221 will grow over the lower surface of catalytic ink 218 to form eyelets as shown at 221(a) in FIG. 8 unless this surface is coated with a temporary mask. Accordingly, to produce the board shown in FIG. 10, a temporary mask will have to be superimposed over the lower surface of catalytic adhesive 218 before electroless metal deposits and then stripped after deposition. Alternatively, the mask on the lower surface could be permanent.

In FIGS. 8 through 10, additional circuit patterns could be imposed on the lower surface as well as the upper surface of the base following the techniques described herein.

To place the embodiments of FIGS. 1–10 in proper perspective, it should be pointed out that whenever distance between hole centers in plated through hole printed circuit boards is 2.5 mm or less, silk screen printing techniques break down due to ink bleed, so that when high density circuit patterns are desired having hole center spacing of 2.5 mm or less, photoprinting techniques will ordinarily be used. It is exactly on such high density boards that conductors between the holes cause the difficulties described above. The permanent non-bleeding solder mask concepts for protecting conductors between plated through holes described in connection with the identified drawings is therefore particularly applicable to manufacture of printed circuit boards having plated through holes whose centers are spaced apart 2.5 mm or less, i.e., between about 1.2 to 2.5 mm; and particularly between 0.8 and 1.2 mm.

It should again be emphasized that the permanent registered insulating mask concept described herein, although suitable for the manufacture of a wide variety of printed circuit boards, has exceptional advantages when used in combination with the catalytic bases described herein to produce high density plated through hole printed circuit boards. Such a technique using the identified materials represents a practical way for achieving even plating on the walls of small, high aspect ratio (small diameter with respect to the thickness of the part) holes. Heretofore, using conventional techniques and materials, the plating on the hole walls has tended to be uneven.

The non-bleeding permanent solder mask concept avoids the problems heretofore described of printing a permanent insulating mask. As has been brought out above, it is very difficult using modern printing concepts to print a registered permanent solder mask on boards on which the hole centers are spaced a distance less than 120 mils. The consensus in the art is that when the holes are less than 100 mils apart, it is practically impossible to print a registered permanent solder mask.

FIGS. 11–13 are flow sheets of procedures for manufacturing a variety of printed circuit products which contain copper as the primary conductive metal using the materials, compositions and techniques described herein. These flow sheets are self-explanatory when read in the light of the foregoing specification. Of course, the procedures of FIGS. 11–15 are equally applicable to products which use metals other than copper, e.g., nickel, as the primary conductive metal.

The following examples illustrate at least one of the best modes of the protective coating compositions and methods of the present invention as presently understood.

Five typical mask compositions are given hereinbelow:

EXAMPLE 1

Formulation 1: Solder Mask Composition

| Material | Amount by Weight (%) |
|---|---|
| A. Formulation Makeup | |
| 50% by weight difunctional bisphenol A epoxy resin having a Durran softening point of about 75° C. and an epoxy equivalent weight of 475–575 in diethylene glycol ethyl ether solvent (epoxy coating modifier) | 537 |
| 70% by weight epoxidized novolac diglycidyl ether bisphenol A resin in diethylene glycol ethyl ether solvent with a 4.4 average epoxide functionality and a melting point of 99° C. | 83.4 |
| diethylene glycol ethyl ether (solvent) | 29.1 |
| 25% by weight copper phthalocyanine pigment (dispersed in bisphenol A epoxy resin with an epoxide equivalent weight of 180–190 and a viscosity of 11,000 to 14,000 at 25° C. as green colorant | 18.3 |
| a fumed silica having an average particle size of 0.015 microns and a total measured surface area of 200 m$^2$/g (thickening agent) | 33.3 |
| polyisobutyl acrylate (flow promoter) | 4.2 |
| a liquid epoxy novolac phenol formaldehyde resin having an epoxy equivalent weight of 172–179 and a viscosity of 1400–2000 centipoise at 25° C. (screening aid) | 18.2 |
| a synethetic silica, dry white powder having a surface area of 150 m$^2$/g and an average particle size of 0.021 microns (flattening agent) | 14.5 |
| B. Primary Curing Agent Composition to be Admixed with A | |
| methane diamine | 61 |
| 2-ethyl hexoic acid salt of tris-(dimethylaminomethyl)phenol | 7.9 |
| carboxy terminated acrylonitrile butadiene and pendant carboxyl groups having an average molecular weight of 3500, a carboxyl content of 2.37% by weight a functionality of 1.85 and having 18% by weight bound acrylonitrile | 16.5 |
| a fumed silica having an average particle size of 0.015 microns and a total measured surface area of 200 m$^2$/g (thickening agent) | 10 |
| C. Modifying Additives to be Added Optionally to A and B for Flame and/or Oxidation Resistance | |
| tetrabromobixphenol-A (a brominated phenol) (flame resistant agent) | 181 |
| a non-volatile hindered phenol (oxidation resistance) | 2.2 |
| 20% by weight dilauryl thiodipropionate in ethylene glycol butyl ether acetate (oxidation resistance) | 11.1 |

Formulation 2: Solder Mask Composition

| Material | Amount by Weight (g) |
| --- | --- |
| A. Formulation Make-up Same as in Formulation 1 Hereinabove | |
| B. Primary Curing Agent to be Admixed with A | |
| 50% by weight triethylenediamine in methyl cellosolve | 127 |
| carboxyl terminated acrylonitrile butadiene and pendant carboxy groups having an average molecular weight of 3500, a carboxyl content of 2.37% by weight, a functionality of 1.85 and having 18% by weight bound acrylonitrile | 16.5 |
| 2-ethyl hexoic acid salt of tris-(dimethyl-aminomethyl)phenol (secondary curing agent) | 4.6 |
| a fumed silica having an average particle size of 0.015 microns and a total measured surfuce area of 200 m$^2$/g (thickening agent) | 10 |

Formulation 3: Solder Mask

A and B are same as in formulation 2 except that 65 grams of N-(2-aminoethyl)-piperedine are used instead of 127 grams of 50% by weight triethylenediamine in methyl cellulose.

Formulation 4: Solder Mask

Parts A and B are same as in formulation 2 except that 60 grams of bis(P-aminocyclohexyl)methane are used instead of 127 grams of 50% by weight triethylenediamine in methyl cellulose.

Formulation 5: Solder Mask

| Material | Amount by Weight (g) |
| --- | --- |
| A. Formulation Make-up Same as in Formulation 1 Hereinabove | |
| B. Primary Curing Agent Composition to be Admixed with A | |
| menthane diamine | 47 |
| dimer acid (primarly composed of C$_{36}$ dibasic acid having a molecular weight of approximately 565) | 13 |
| 2-ethyl hexoic acid salt of tris-(dimethyl-aminomethyl)phenol (secondary curing agent) | 6 |

Electroless nickel baths which may be used are described in Brenner, *Metal Finishing,* November, 1954, pages 68–76. They comprise aqueous solutions of a nickel salt, such as nickel chloride, an active chemical reducing agent for the nickel salt, such as the hypophosphite ion; and a complexing agent, such as carboxylic acids and salts thereof.

Electroless nickel baths which may be used are described in Brenner, *Metal Finishing,* November, 1954, pages 68 to 76. They comprise aqueous solutions of a nickel salt, such as nickel chloride, an active chemical reducing agent for the nickel salt, such as the hypophosphite ion; and a complexing agent, such as carboxylic acids and salts thereof.

Electroless gold plating baths which may be used are disclosed in U.S. Pat. No. 3,589,916. They contain a water soluble gold salt, such as gold chloride, a reducing agent for the gold salt, such as the dimethylamine borane, a chelating or complexing agent, such as sodium potassium tartrate and a stabilizer such as sodium cyanide. The purpose of the complexing agent is to maintain the gold in solution as a water soluble gold complex. The pH of the bath will be about 13 or between about 10 and 14.

A specific example of an electroless copper depositing bath suitable for use is a bath having the following composition:

| | |
| --- | --- |
| N,N,N$^1$,N$^1$tetrakis (2-hydroxypropyl) ethylenediamine | 18 g/l |
| CuSO$_4$—5H$_2$O | 10 g/l |
| Formaldehyde (37% Soln) | 4 ml/l |
| Wetting Agent (GAFAC-RE610) (Commercially available from GAF Corporation) (believed to be a phosphate ester of alkylphenol-polyethylene oxide) | 0.01 g/l |
| Sodium hydroxide | to desired pH (12–13) |
| Sodium cyanide (NaCN) | 25 mg/l |
| 2-mercapto benzothiazole | 10 mg/l |

This bath is preferably operated at a temperature of about 52° C. and will deposit a coating of ductile electroless copper about 35 microns thick in about 18 hours.

Utilizing the electroless metal baths of the type described, very thin conducting metal films may be laid down. Ordinarily, the metal films superimposed by electroless metal deposition will range from 2.5 to 100 microns in thickness, with metal films having a thickness of even less than 2.5 microns a distinct possibility.

What is claimed is:

1. In a permanent, protective coating composition useful in the manufacture of printed circuit boards, said coating composition comprised of a thermosetting epoxy resin and curing composition dissolved in a solvent; and a flow promoter; said curing composition present in an amount sufficient to effect substantially complete cure of said thermosetting resin, said coating composition being in an initial state as a high viscosity solution and having an apparent viscosity between about 10,000 centipoise and about 200,000 centipoise, said coating composition upon curing, being transformed from said initial state into a final state as a solid, the improvement which comprises:

said composition further including a thickening agent in an amount sufficient to gel said high viscosity solution into a soft gel-like initial state, said composition, upon curing, being transformed from said soft gel-like initial state directly into a cross-linked solid;

said thermosetting epoxy resin being a solid at room temperature, having a melting point between 60° C. and about 200° C., and having an epoxide functionality greater than about 3;

said curing composition including:

a primary curing agent comprised of an alicyclic polyamine which is corrosive to copper surfaces, the primary curing agent being present in an amount sufficient to effect substantially complete cure of the thermosetting epoxy resin; and a secondary curing agent comprised of an aromatic amine, said secondary curing agent being present in an amount sufficient to provide said cured coating composition with resistance to flux removal processes.

2. A composition as defined in claim 1 wherein said thickening agent is a fumed silica comprised of particles of submicroscopic size with a total surface area between 200 and 400 m²/g, and further including an organic acid having at least 2 carboxyl groups in an amount sufficient to reduce or eliminate the basicity of the alicyclic amine in said coating composition while retaining the thixotropic character of said coating composition.

3. A composition as defined in claim 1 further including at least one modifying agent selected from the group consisting of a screening aid and a toughener.

4. A composition as defined in claim 1 wherein said protective coating composition further includes an antioxidant modifying agent.

5. A composition as defined in claim 1 wherein said coating composition further includes an antioxidant selected from the group consisting of thioesters, phosphites, phenols and mixtures thereof.

6. A composition as defined in claim 1 wherein said thermosetting epoxy resin epoxide functionality is more than about 3 and less than about 10.

7. A composition as defined in claim 1 wherein said thermosetting epoxy resin epoxide functionality is more than about 4 and less than about 7.

8. A composition as defined in claim 3 wherein one of said modifying agents is said screening aid, said screening aid comprising an epoxy resin which is liquid at room temperature, said liquid epoxy resin having an epoxy equivalent weight below about 225.

9. A composition as defined in claim 3 wherein said flow promoter comprises an alkyl acrylate polymer or a silicone.

10. A composition as defined in claim 3 wherein one of said modifying agents is said toughener, said toughener comprising a liquid acrylonitrile butadiene copolymer, a solid epoxy resin with an epoxy equivalent weight about 350 or a combination thereof.

11. A composition as defined in claim 1 wherein said thickening agent comprises an amine treated bentonite.

12. A composition as defined in claim 1 where said alicyclic polyamine is selected from the group consisting of methane diamine; 1,3-diamino-cyclohexane, isophorone diamine; triethylenediamine and hexamethylenetetramine.

13. A composition as defined in claim 1 where said aromatic amine is selected from the group consisting of tris-2-ethyl hexoate salt of tris(dimethylaminomethyl)-phenol; diamino diphenyl sulfone; benzyl dimethyl amine; metaphenylene diamine; and methylene dianiline.

14. A composition as defined in claim 2 wherein said organic acid is selected from the group consisting of carboxyl terminated liquid acrylonitrile rubbers with or without pendant carboxyl groups, fatty acids and dibasic acids.

15. A composition as defined in claim 14 wherein said fatty acids are selected from the group consisting of linoleic acid and oleic acid, and said dibasic acid is selected from the group consisting of an adipic acid, glutaric acid, azelaic acid, sebasic acid and suberic acid.

16. A permanent, protective coating composition for use in the manufacture of printed circuit boards, said composition comprising:

an epoxy resin dissolved in a solvent, said epoxy resin being a solid at room temperature, having an epoxide functionality more than about 3 and less than about 10, and having a melting point between about 60° C. and about 200° C.;

a screening aid comprised of an epoxy resin which is liquid at room temperature;

a flow promoter comprised of acrylate polymers and/or silicone;

a toughener comprised of a liquid acrylonitrile polybutadiene and/or a solid epoxy resin having an epoxy equivalent weight above about 350;

a primary curing agent comprised of an alicyclic polyamine which is corrosive to copper surfaces, said curing agent being present in an amount sufficient to effect substantially complete cure of said coating composition, said coating composition upon being cured transforming a high viscosity solution having an apparent viscosity between about 10,000 centipoise and about 200,000 centipoise into a solid; and a secondary curing agent comprised of an aromatic amine, said secondary curing agent being present in an amount sufficient to provide said cured coating composition with resistance to flux removal processes;

a thickening agent in an amount sufficient to gel said high viscosity solution into a soft gel-like phase, said coating composition upon being cured transformed from said soft gel-like phase directly into a solid; and an organic acid in an amount sufficient to reduce or eliminate the basicity of the alicyclic polyamine in said protective coating composition while retaining the thixotropic character of said protective coating composition prior to its curing.

17. A composition as defined in claim 16 further including an antioxidant comprised of a thioester, phosphite, phenol or a mixture thereof.

18. A composition as defined in claim 16 wherein said thickening agent comprises a fumed silica having particles of submicroscopic size with a total surface area of 200 to 400 m²/g and where said aromatic amine is selected from the group consisting of tris-2-ethyl hexoate salt of tris(dimethylaminomethyl)phenol; diamino diphenyl sulfone; benzyl dimethyl amine; metaphenylene diamine; and methylene dianiline, and wherein said organic acid is selected from the group consisting of toughening agents, fatty acids and dibasic acids.

* * * * *